(12) United States Patent
Fujihara et al.

(10) Patent No.: US 11,688,823 B2
(45) Date of Patent: Jun. 27, 2023

(54) PHOTOCOUPLER

(71) Applicants: Kabushiki Kaisha Toshiba, Tokyo (JP); Toshiba Electronic Devices & Storage Corporation, Tokyo (JP)

(72) Inventors: Mami Fujihara, Nakatsu Oita (JP); Yoshio Noguchi, Kitakyushu Fukuoka (JP); Naoya Takai, Yukuhashi Fukuoka (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/562,585

(22) Filed: Sep. 6, 2019

(65) Prior Publication Data
US 2020/0161494 A1    May 21, 2020

(30) Foreign Application Priority Data

Nov. 21, 2018    (JP) .............................. JP2018-218229

(51) Int. Cl.
*H01L 31/167*    (2006.01)
*H01L 31/02*    (2006.01)
(Continued)

(52) U.S. Cl.
CPC ........ *H01L 31/167* (2013.01); *H01L 23/3121* (2013.01); *H01L 23/49513* (2013.01);
(Continued)

(58) Field of Classification Search
None
See application file for complete search history.

(56) References Cited

U.S. PATENT DOCUMENTS 9,070,817 B2 *  6/2015  Fujimoto .............. H01L 31/173
9,099,602 B2    8/2015  Noguchi et al.
(Continued)

FOREIGN PATENT DOCUMENTS

JP    S63-086462 A    4/1988
JP    2007-165621 A   6/2007
(Continued)

*Primary Examiner* — Steven M Christopher
(74) *Attorney, Agent, or Firm* — Allen & Overy LLP

(57) ABSTRACT

A photocoupler of an embodiment includes an input terminal, an output terminal, a first MOSFET, a second MOSFET, a semiconductor light receiving element, a semiconductor light emitting element, and a resin layer. The first MOSFET is joined onto the third lead. The second MOSFET is joined onto the fourth lead. The semiconductor light receiving element is joined to each of the first junction region and the second junction region. The semiconductor light receiving element includes a light receiving region provided in a central part of a surface on opposite side from a surface joined to the first and second MOSFET. The resin layer seals the first and second MOSFETs, the semiconductor light receiving element, the semiconductor light emitting element, an upper surface and a side surface of the input terminal, and an upper surface and a side surface of the output terminal.

10 Claims, 8 Drawing Sheets

(51) Int. Cl.
*H01L 23/31* (2006.01)
*H01L 23/00* (2006.01)
*H01L 25/16* (2023.01)
*H01L 23/495* (2006.01)
*H01L 33/30* (2010.01)
*H01L 33/62* (2010.01)
*H01L 33/40* (2010.01)
*H01L 33/42* (2010.01)

(52) U.S. Cl.
CPC ........ *H01L 23/49575* (2013.01); *H01L 24/32* (2013.01); *H01L 24/48* (2013.01); *H01L 24/73* (2013.01); *H01L 25/167* (2013.01); *H01L 31/02005* (2013.01); *H01L 31/02019* (2013.01); *H01L 24/45* (2013.01); *H01L 33/30* (2013.01); *H01L 33/405* (2013.01); *H01L 33/42* (2013.01); *H01L 33/62* (2013.01); *H01L 2224/32245* (2013.01); *H01L 2224/32502* (2013.01); *H01L 2224/45144* (2013.01); *H01L 2224/73265* (2013.01); *H01L 2924/01079* (2013.01); *H01L 2924/01322* (2013.01); *H01L 2924/10253* (2013.01); *H01L 2924/12041* (2013.01); *H01L 2924/12043* (2013.01); *H01L 2924/13091* (2013.01)

(56) References Cited

U.S. PATENT DOCUMENTS

| | | | |
|---|---|---|---|
| 9,887,311 B2 * | 2/2018 | Kurosawa | H01L 33/62 |
| 2007/0187629 A1 | 8/2007 | Matsuyama | |
| 2015/0060892 A1 * | 3/2015 | Noguchi | H01L 25/167 |
| | | | 257/82 |
| 2015/0069423 A1 * | 3/2015 | Yamamoto | H01L 31/173 |
| | | | 257/82 |
| 2015/0263184 A1 * | 9/2015 | Takai | H01L 31/167 |
| | | | 257/82 |
| 2017/0052277 A1 * | 2/2017 | Wong | G01V 8/12 |
| 2018/0138379 A1 * | 5/2018 | Sorg | H01L 24/48 |

FOREIGN PATENT DOCUMENTS

| | | |
|---|---|---|
| JP | 2008-117962 A | 5/2008 |
| JP | 2008-177218 A | 7/2008 |
| JP | 2015-050281 A | 3/2015 |
| JP | 2015-056531 A | 3/2015 |
| JP | 2016-219823 A | 12/2016 |
| JP | 2017-147364 A | 8/2017 |

* cited by examiner

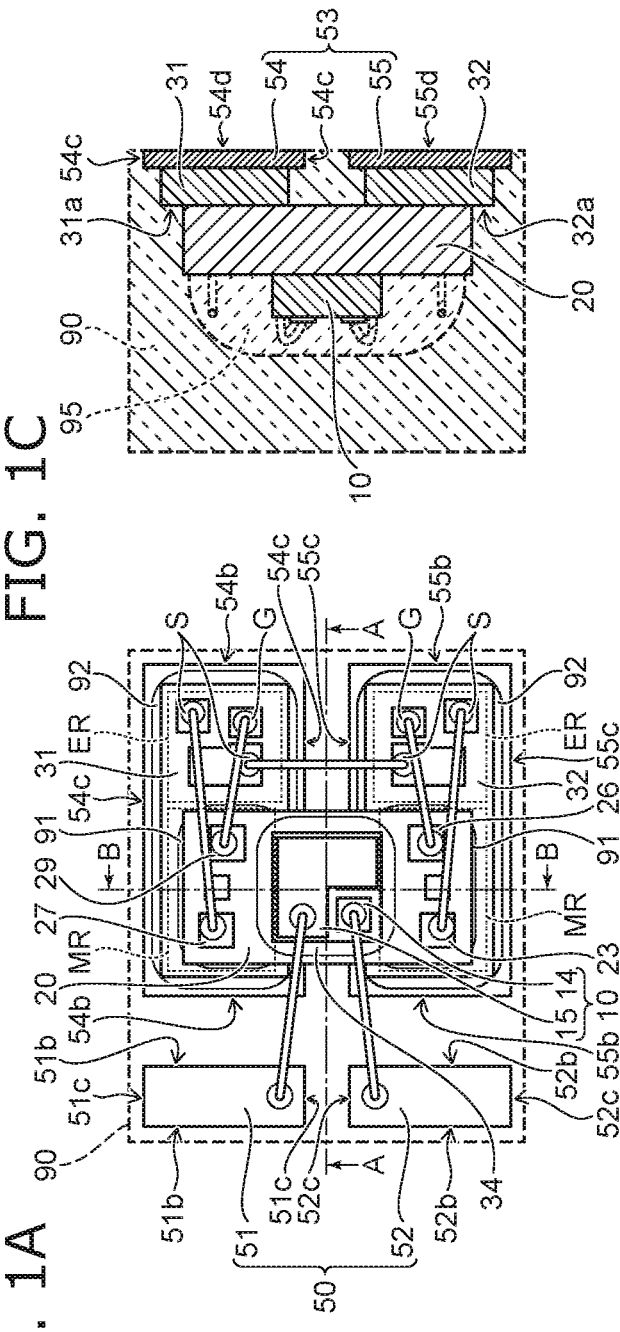
FIG. 1A
FIG. 1C
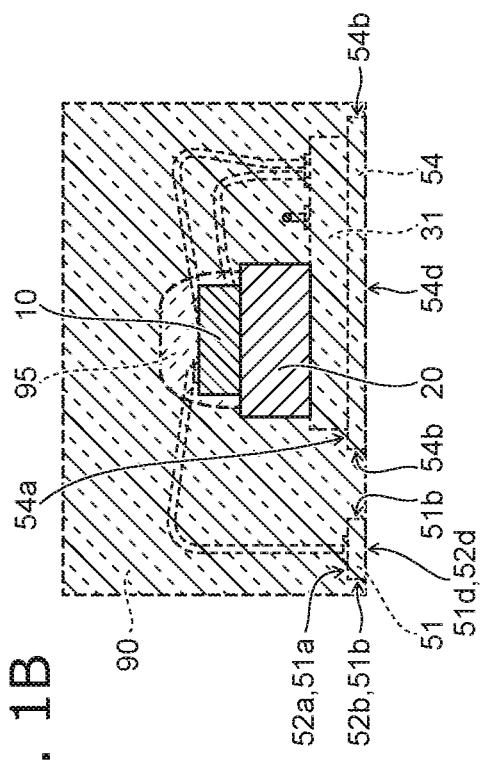
FIG. 1B

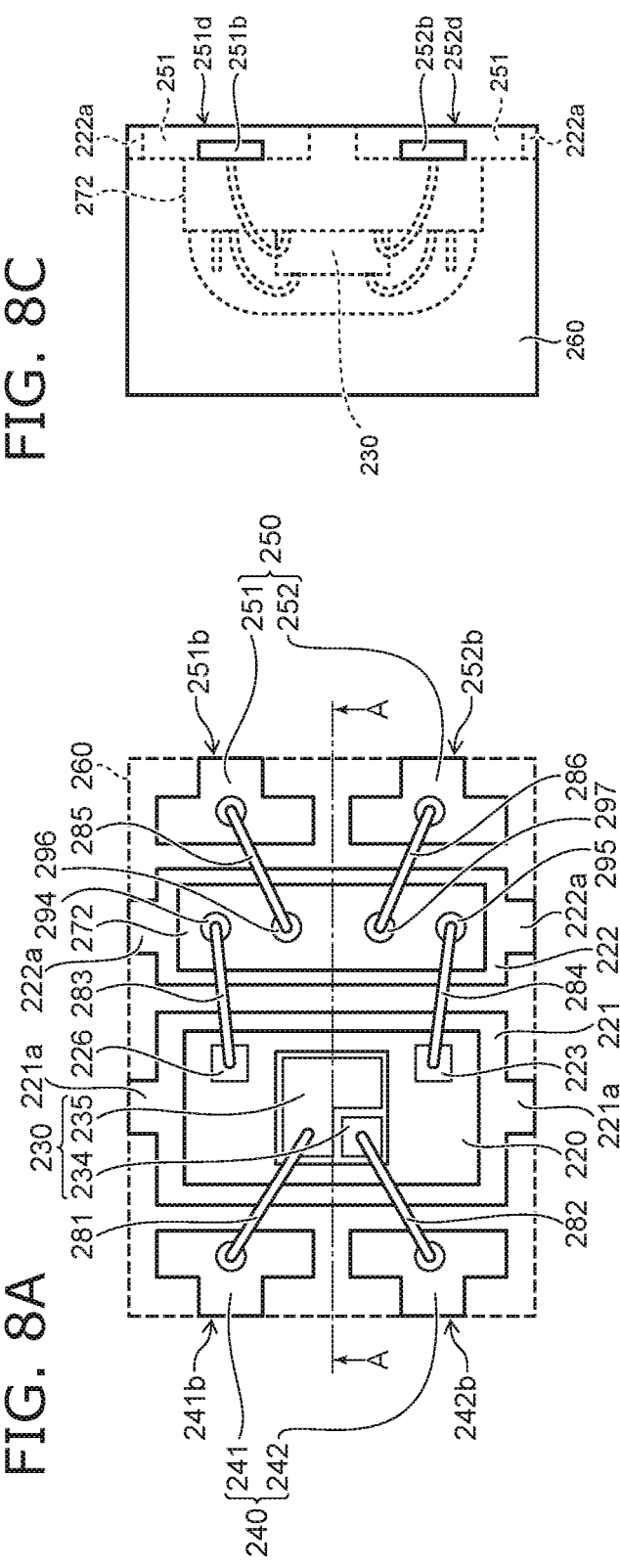

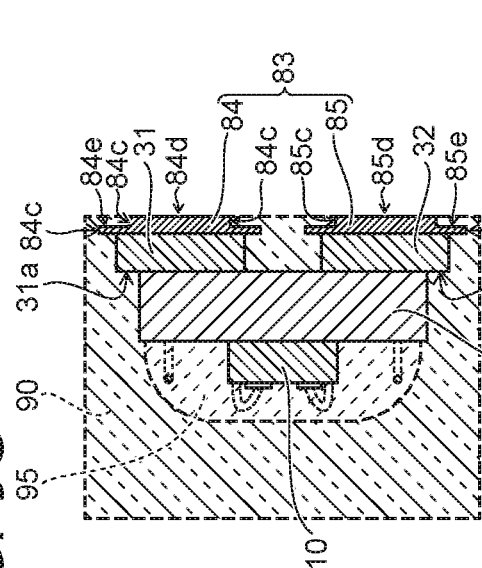
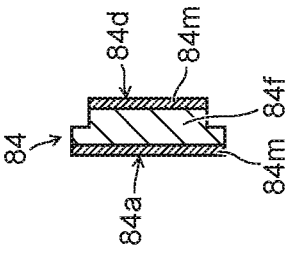
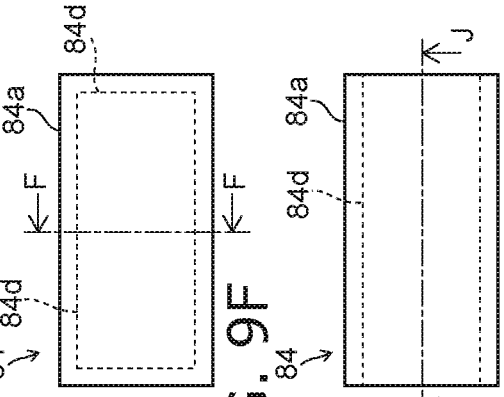
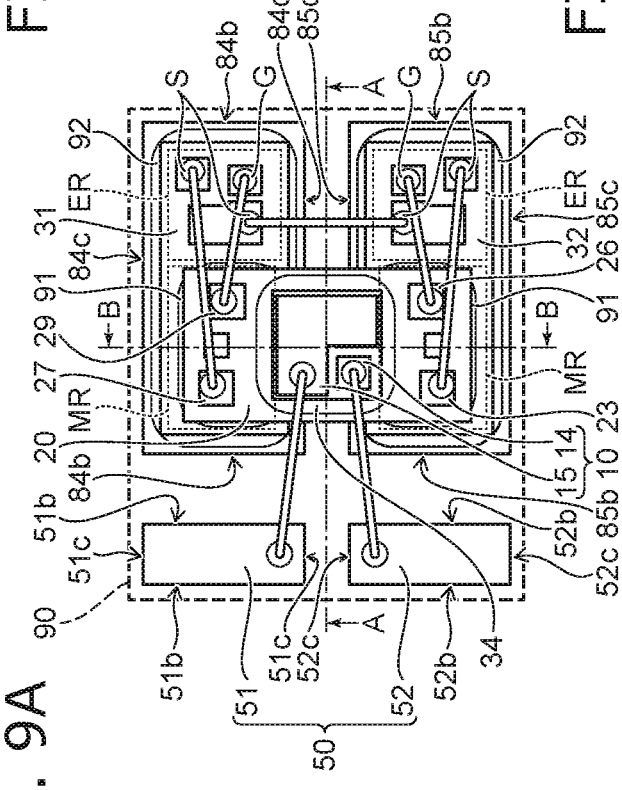
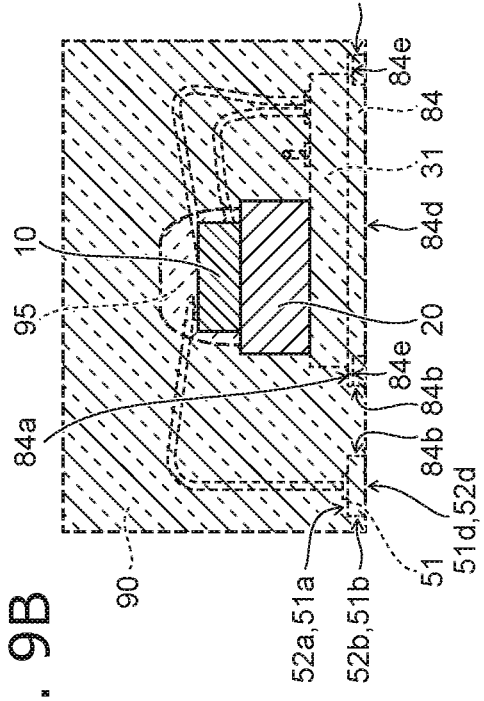

US 11,688,823 B2

PHOTOCOUPLER

CROSS-REFERENCE TO RELATED APPLICATIONS

This application is based upon and claims the benefit of priority from Japanese Patent Application No. 2018-218229, filed on Nov. 21, 2018; the entire contents of which are incorporated herein by reference.

FIELD

Embodiments described herein relate generally to a photocoupler

BACKGROUND

A photocoupler (or a photorelay) can convert an input electrical signal to an optical signal using a light emitting element. After the optical signal is received by a light receiving element, the photocoupler can output an electrical signal. Thus, the photocoupler can transmit an electrical signal in a state in which the input and the output are insulated from each other.

Applications such as machine tool control and semiconductor testers increasingly require speed-up of the photocoupler. For instance, they require high-frequency passing characteristics of 5 GHz or more. Furthermore, these applications need numerous photocouplers in order to configure a system. In these cases, a surface-mounted package having a small footprint and low profile is required for high-density mounting on a circuit substrate.

BRIEF DESCRIPTION OF THE DRAWINGS

FIG. 1A is a schematic plan view of a photocoupler according to a first embodiment, FIG. 1B is a schematic sectional view taken along line A-A, and FIG. 1C is a schematic sectional view taken along line B-B;

FIG. 8A is a schematic plan view of a photocoupler according to a third embodiment, FIG. 8B is a schematic sectional view, and FIG. 8C is a schematic side view; and FIG. 9A is a schematic plan view of a photocoupler according to a fourth embodiment, FIG. 9B is a schematic sectional view taken along line A-A, FIG. 9C is a schematic sectional view taken along line B-B, FIG. 9D is a schematic plan view of a first modified example of the output terminal, FIG. 9E is a schematic sectional view of the first example of the output terminal taken along line F-F, and FIG. 9F is a schematic plan view of a second modified example of the output terminal.

DETAILED DESCRIPTION

Figure 2A:
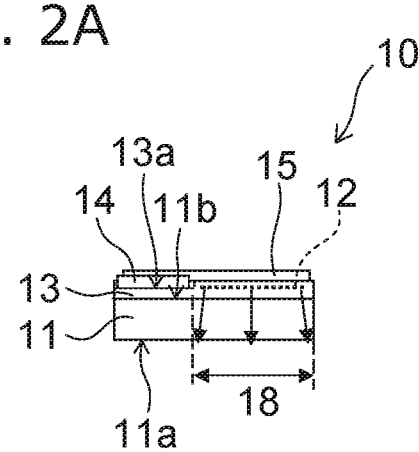
FIG. 2A is a schematic side view of the semiconductor light emitting element.

In general, a photocoupler of an embodiment includes an input terminal, an output terminal, a first MOSFET, a second MOSFET, a semiconductor light receiving element, a semiconductor light emitting element, and a resin layer. The input terminal includes a first lead and a second lead. The output terminal includes a third lead and a fourth lead. The first MOSFET has a first surface including a first electrode pad region and a first junction region located adjacent to the first lead. The first MOSFET is joined onto the third lead, and thereby a drain region of the first MOSFET is electrically connected to the third lead. The second MOSFET has a first surface including a second electrode pad region and a second junction region located adjacent to the second lead. The second MOSFET is joined onto the fourth lead, and thereby a drain region of the second MOSFET is electrically connected to the fourth lead. The semiconductor light receiving element is joined to each of the first junction region and the second junction region. The semiconductor light receiving element includes a light receiving region provided in a central part of a surface on opposite side from a surface joined to the first and second MOSFETs, and an electrode pad region provided outside the light receiving region. The semiconductor light emitting element is connected to the input terminal and is capable of emitting emission light toward the light receiving region. The resin layer seals the first and second MOSFETs, the semiconductor light receiving element, the semiconductor light emitting element, an upper surface and a side surface of the input terminal, and an upper surface and a side surface of the output terminal.

Embodiments of the invention will now be described with reference to the drawings.

FIG. 1A is a schematic plan view of a photocoupler according to a first embodiment. FIG. 1B is a schematic sectional view taken along line A-A. FIG. 1C is a schematic sectional view taken along line B-B.

The photocoupler includes an input terminal 50, an output terminal 53, a first MOSFET 31, a second MOSFET 32, a semiconductor light receiving element 20, a semiconductor light emitting element 10, and a resin layer 90.

The input terminal 50 includes a first lead 51 and a second lead 52. The output terminal 53 includes a third lead 54 and a fourth lead 55 spaced from each other and configured as a single-piece member. Each lead is not exposed to the upper surface and four side surfaces of the photocoupler. Each lead is covered with the resin layer 90. Only the lower surface of the lead is exposed.

FIGS. 1A to 1C show the photocoupler after singulation. The lead is made of e.g. iron-nickel alloy or copper alloy. At least e.g. a Au plating layer or Ag plating layer is formed on the surface of the region joined to a semiconductor chip with solder material or conductive past material (Al, Ag and so on) and the surface of the region subjected to wire bonding.

The first MOSFET 31 has a first surface 31a including a first electrode pad region ER and a first junction region MR located adjacent to the first lead 51 (FIG. 1A). The first MOSFET 31 is joined to the surface of the third lead 54. Thus, the drain region is electrically connected to the third lead 54.

The second MOSFET 32 has a first surface 32a including a second electrode pad region ER and a second junction region MR provided adjacent to the second lead 52 (FIG. 1A). The second MOSFET 32 is joined to the surface of the fourth lead 55. Thus, the drain region is electrically connected to the fourth lead 55.

When the MOSFET is made of Si material, the MOSFET can be configured in a vertical structure in which the back surface side of the chip constitutes a drain region. The back surface of the MOSFETs 31, 32 joined to the third lead 54 and the fourth lead 55 constituting the output terminal 53 can be configured as e.g. a high-concentration contact layer (not shown). When an electrode containing e.g. Au is provided on the contact layer, it can be joined to the third lead 54 and the fourth lead 55 with e.g. paste material or solder material 92. Alternatively, AuSi eutectic crystal may be formed from the contact layer (Si) and the gold electrode of the lead surface. The MOSFET is not limited to the vertical structure. The electrical connection relation is the same also in the lateral structure. These chips may be integrated into a single chip.

The semiconductor light receiving element 20 is bonded astride the first junction region MR and the second junction region MR with an adhesive 91. The semiconductor light receiving element 20 includes a light receiving region provided in a central part of a surface on the opposite side from the surface joined to the surface 31a of the first MOSFET 31 and the surface 32a of the second MOSFET 32, and an electrode pad region provided outside the light receiving region. The semiconductor light receiving element 20 can be e.g. a Si diode or phototransistor.

The semiconductor light emitting element 10 is connected to the input terminal 50. The semiconductor light emitting element 10 emits emission light (shown by downward arrows in FIGS. 2A and 2D) toward the light receiving region. The material of the semiconductor light emitting element 10 can be e.g. InGaAs, AlGaAs or GaAs. A combination of materials preferable for downsizing is such that the light of the light emitting layer 12 is transmitted through the substrate 11.

The resin layer 90 seals the first and second MOSFETs 31, 32, the semiconductor light receiving element 20, the semiconductor light emitting element 10, the upper surface 51a and the side surface 51b, 51c of the first lead 51 and the upper surface 52a and the side surface 52b, 52c of the second lead 52 of the input terminal 50, and the upper surface 54a and the side surface 54b, 54c of the third lead 54 and the upper surface 55a and the side surface 55b, 55c of the third lead 55 of the output terminal 53. However, the lower surface 51d, 52d of the input terminal 50 and the lower surface 54d, 55d of the output terminal 53 are not sealed but exposed. At the surface to which the lower surface of the photocoupler, i.e. the lower surfaces 51d, 52d, 54d, 55d of the input and output terminals 51, 53 are exposed, the resin layer 90 adjacent to the lower surfaces of the output terminal can be made generally flush. This enables the photocoupler to be surface-mounted on the circuit substrate.

The photocoupler may further include a bonding layer 34. The bonding layer 34 bonds the light receiving region 22 and the semiconductor light emitting element 10. The bonding layer 34 is translucent and insulative. Furthermore, an encapsulation resin 95 made of e.g. silicone resin may be applied. The encapsulation resin 95 covers the upper and side surfaces of the semiconductor light emitting element 10 and the upper surface of the semiconductor light receiving element 20 and is sealed with the sealing layer 90. The encapsulation resin 95 prevents peeling of the semiconductor light emitting element 10 and reduces resin stress from the sealing layer 90. Thus, the encapsulation resin 95 further improves reliability. Furthermore, the encapsulation resin 95 is interposed between the input/output terminal 50, 53 and the sealing layer 90 spaced from each other. This can suppress deformation of the outline of the photocoupler due to the air gap between the sealing layer 90 and the encapsulation resin 95 and the plastic deformation of the encapsulation resin 95 itself caused by the linear expansion coefficient difference.

As described later with reference to FIG. 3, the first and second MOSFETs 31, 32 are in common source connection. The two source electrodes S are connected to the second electrodes 23, 27 of the semiconductor light receiving element 20, respectively. The gate electrodes G of the first and second MOSFETs 31, 32 are connected to the first electrodes 26, 29 of the semiconductor light receiving element 20, respectively.

Figure 2B:
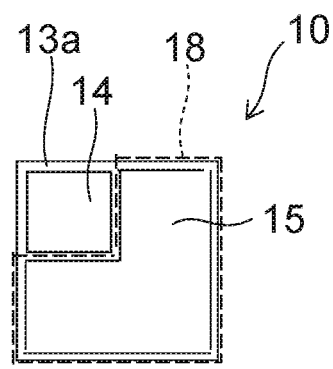
FIG. 2B is a schematic plan view thereof.
Figure 2C:
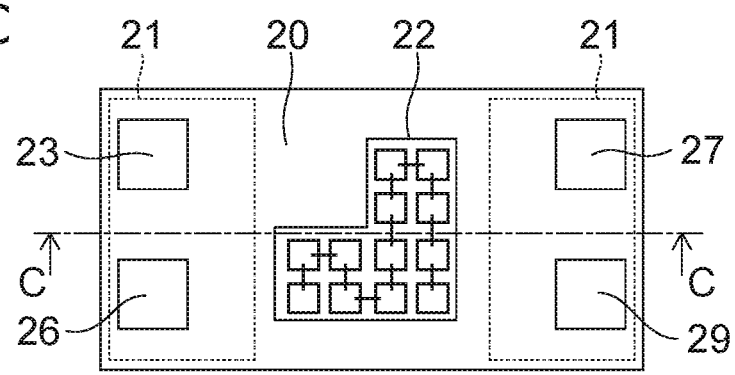
FIG. 2C is a schematic plan view of the semiconductor light receiving element.
Figure 2D:
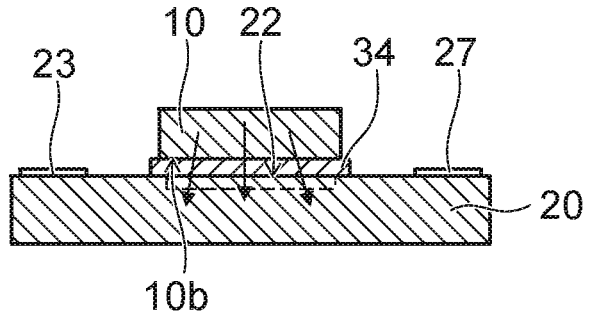
FIG. 2D is a schematic sectional view of the stacked structure taken along line C-C.

FIG. 2A is a schematic side view of the semiconductor light emitting element. FIG. 2B is a schematic plan view thereof. FIG. 2C is a schematic plan view of the semiconductor light receiving element. FIG. 2D is a schematic sectional view of the stacked structure taken along line C-C.

As shown in FIG. 2A, the translucent substrate 11 has a first surface 11a and a second surface 11b on the opposite side from the first surface 11a. A semiconductor stacked body 13 including a light emitting layer 12 (dotted line) is provided on the second surface 11b. The semiconductor stacked body 13 includes a step difference part on the surface on the opposite side from the substrate 11 side. The step difference part extends from the surface of the semiconductor stacked body 13 to below the light emitting layer 12. The step difference part has a bottom surface 13a.

The substrate 11 may be made of GaAs, and the active layer may be made of e.g. AlGaAs-based or InGaAs-based material. In this case, the semiconductor light emitting element emits near-infrared to infrared light.

A first electrode 14 is provided on the bottom surface 13a of the step difference part. A second electrode 15 is provided on the surface of the semiconductor stacked body 13 other than the step difference part. When the second electrode 15 covers the light emitting layer 12 from above, most of the emission light directed upward is reflected by the second electrode 15. This can reduce upward emission light. In order to improve reflectance further, it is also possible to adopt an ohmic bonding metal containing no alloy layer, or a stacked structure of a transparent semiconductor electrode and a reflective metal layer. This can suppress emission light to the upper surface and external light leakage with a minimum resin thickness. The emission light (shown by arrows) directed downward from the light emitting layer 12 is emitted from a light emitting region 18 of a second surface 10b of the light emitting element 10 and is incident on the light receiving region 22 of the semiconductor light receiving element 20. The light receiving region 22 includes e.g. a series-connected p-n junction region. This can improve photovoltaic power. The semiconductor light receiving element 20 includes an electrode pad region 21 outside the light receiving region 22.

The light receiving region 22 of the semiconductor light receiving element 20 shown in FIG. 2C can be included e.g. inside the light emitting region 18 of the semiconductor light emitting element 10 as viewed from above. Then, the light receiving region 22 does not extend out from the semiconductor light emitting element 10. This is more preferable because the distribution of photovoltaic power can be averaged inside the light receiving region 22. The electrode pad region 21 is provided outside the light receiving region 22. The semiconductor light receiving element 20 includes a first electrode 26, 29 connected to one conductivity-type layer of a p-n junction and a second electrode 23, 27 connected to the other conductivity-type layer of the p-n junction.

As shown in FIG. 2D, the emission light (shown by arrows) emitted from the light emitting region 18 and transmitted through the bonding layer 34 is incident on the light receiving region 22. The bonding layer 34 is thin. Thus, the emission light from the semiconductor light emitting element 10 is efficiently incident on the light receiving region 22 from the light emitting region 18. This can suppress light leakage to other control element parts and improve the stability of the operation thereof. Each of the first and second electrodes 14, 15 of the semiconductor light emitting element 10 can be connected to the input terminal 50 by e.g. a bonding wire.

Figure 3:
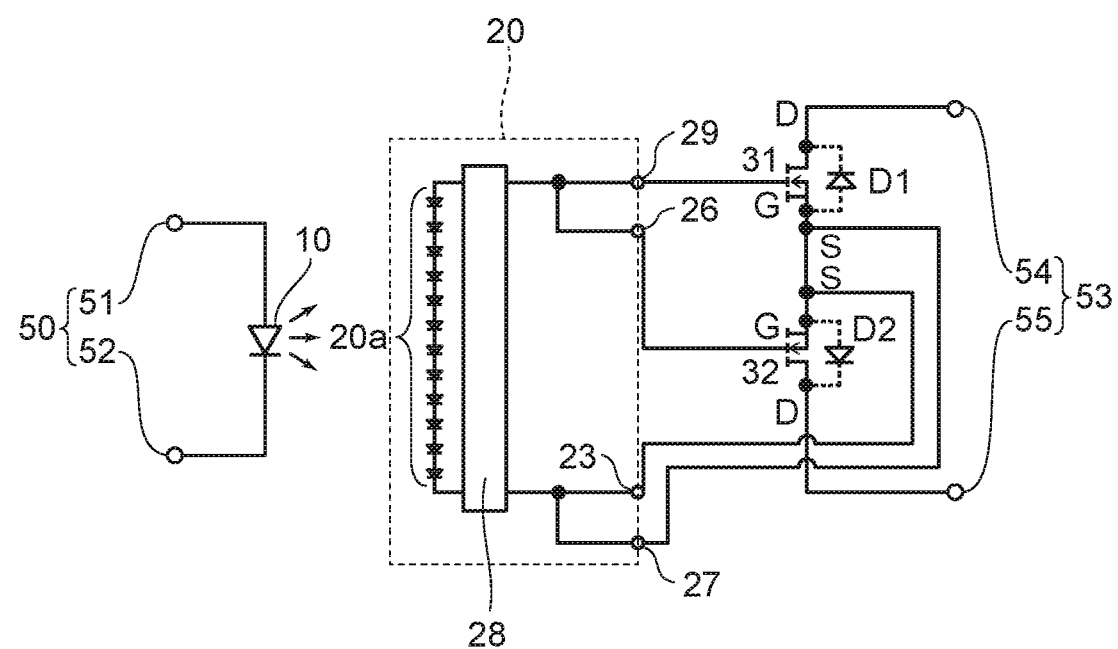
FIG. 3 is an equivalent circuit diagram of the photocoupler according to the first embodiment.

FIG. 3 is an equivalent circuit diagram of the photocoupler according to the first embodiment.

The semiconductor light receiving element 20 can further include a control circuit 28. The control circuit 28 is connected to each of the first electrode 26, 29 and the second electrode 23, 27 of the photodiode array 20a. When the optical signal is on, the control circuit 28 supplies the current and voltage of the photodiode array 20a to the MOSFET 31, 32. (For instance, the path between the terminal 26, 29 and the terminal 23, 27 is made open.) When the optical signal is off, the control circuit 28 makes a short circuit between the gate G and the source S of the MOSFET 31, 32 to extract stored charge, thereby turning off the MOSFET 31, 32. (For instance, the path between the first electrode 26, 29 and the second electrode 23, 27 is short-circuited.)

The simplest configuration of the control circuit 28 is to connect a resistor between the first electrode 26, 29 and the second electrode 23, 27. Such a configuration can supply a voltage to each gate of the MOSFETs 31, 32 in source common connection.

The MOSFETs 31, 32 can be of e.g. the n-channel enhancement type. The MOSFET 31, 32 is connected to the second electrode 23, 27 of the photodiode array 20a. Each gate is connected to the first electrode 26, 29. Each drain D constitutes the output terminal 53.

When the optical signal is on, the MOSFETs 31, 32 are both turned on and connected to an external circuit including the power supply and the load through the output terminal 53. On the other hand, when the optical signal is off, the MOSFETs 31, 32 are both turned off and disconnected from the external circuit. In source common connection, switching such as disconnection and connection of analog signals and AC signals is facilitated between the third lead 54 of the output terminal and the fourth lead 55 of the output terminal.

Normally, parasitic p-n diodes D1, D2 shown by dashed lines exist between the drain and the source. When the MOSFETs 31, 32 are on, one of the parasitic diodes D1, D2 can constitute part of the current path. Thus, two MOSFETs 31, 32 in source common connection enable AC load control.

The input terminal 50 of the photocoupler performs on-off operation of the two MOSFETs 31, 32 in response to an input signal applied by a DC current. At on-time, a high-frequency signal is transmitted between the third lead 54 of the output terminal and the fourth lead 55 of the output terminal. High-frequency transmission characteristics can be determined by measuring the transmittance (voltage ratio) of the high-frequency signal in terms of the S parameter. In the first embodiment, the drains of the two MOSFETs are directly connected to the third lead 54 and the fourth lead 55. This suppresses the decrease of high-frequency transmission characteristics on the high-frequency side.

Figure 4C:
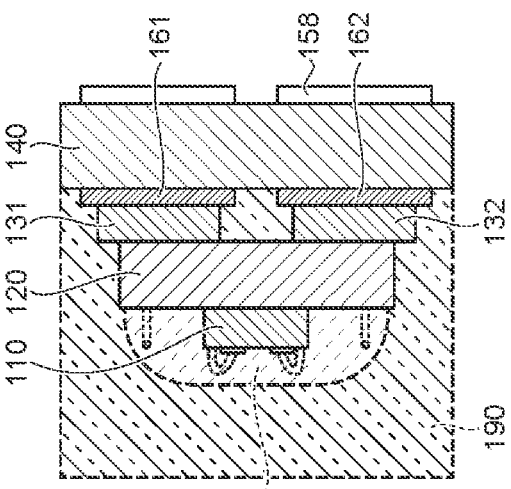
FIG. 4C is a schematic sectional view taken along line E-E.
Figure 4A:
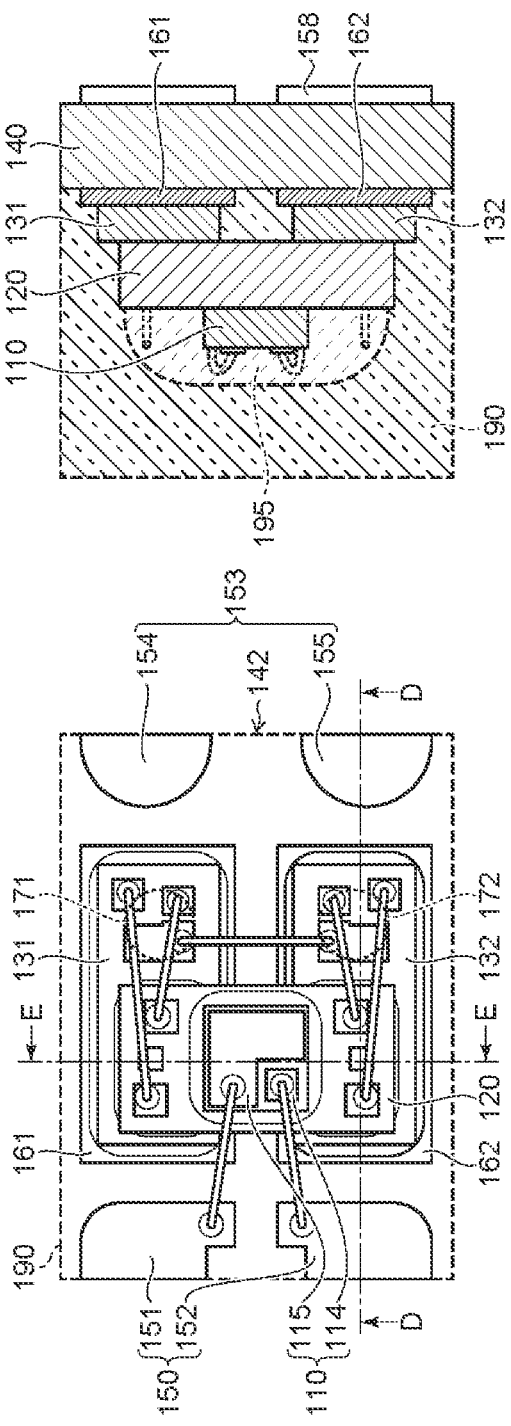
FIG. 4A is a schematic plan view of a photocoupler according to a comparative example.
Figure 4B:
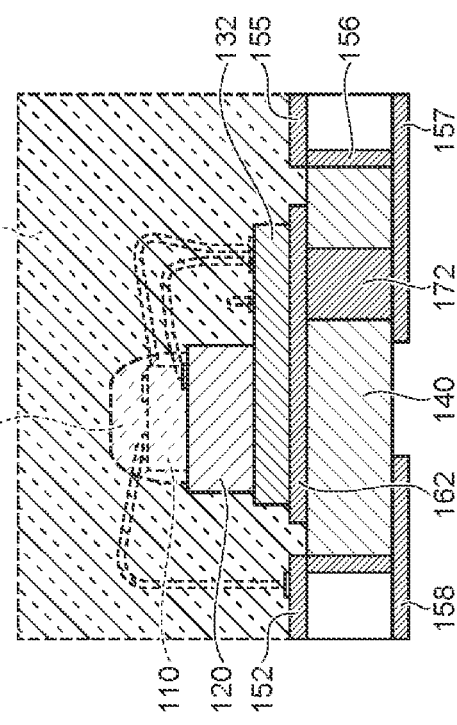
FIG. 4B is a schematic sectional view taken along line D-D.

FIG. 4A is a schematic plan view of a photocoupler according to a comparative example. FIG. 4B is a schematic sectional view taken along line D-D. FIG. 4C is a schematic sectional view taken along line E-E.

In the photocoupler according to the comparative example, a semiconductor light receiving element 120, a semiconductor light emitting element 110, and first and second MOSFETs 131, 132 are placed on a mounting member. The mounting member includes an insulating substrate 140, an input terminal 150 provided on the surface of the insulating substrate 140, die pads 161, 162, and an output terminal 153 provided on the surface of the insulating substrate 140.

On the die pads 161, 162, the first and second MOSFETs 131, 132, respectively, the semiconductor light receiving element 120, and the semiconductor light emitting element 110 are provided in this order. The insulating substrate 140 is provided with through holes. The through holes are buried with buried conductor layers 171, 172 for connecting the die pads 161, 162 and the back surface conductive layer of the output terminal 153, respectively. A conductive layer is provided on the side surface of the insulating substrate 140 on the output terminal 153 side in order to form a solder fillet. For instance, in FIG. 4B, the fourth conductive region 155 of the output terminal 153 is connected to a back side conductive region 157 through a via conductive region 156 provided on the sidewall of a notch part provided in a second surface 142 of the insulating substrate 140. Likewise, via conductive regions and back side conductive regions are provided also for the first conductive region 151, the second conductive region 152, and the third conductive region 154.

In the comparative example, as shown in FIG. 4B, the buried conductor layers 171, 172 connect between the die pad 161 and the third conductive region 154 and between the die pad 162 and the fourth conductive region 155. Preferably, the thickness of the insulating substrate 140 is set to e.g. 150 µm or more in order to maintain the mechanical strength. The buried conductor layer 171, 172 is shaped like e.g. a circular cylinder.

Figure 5:
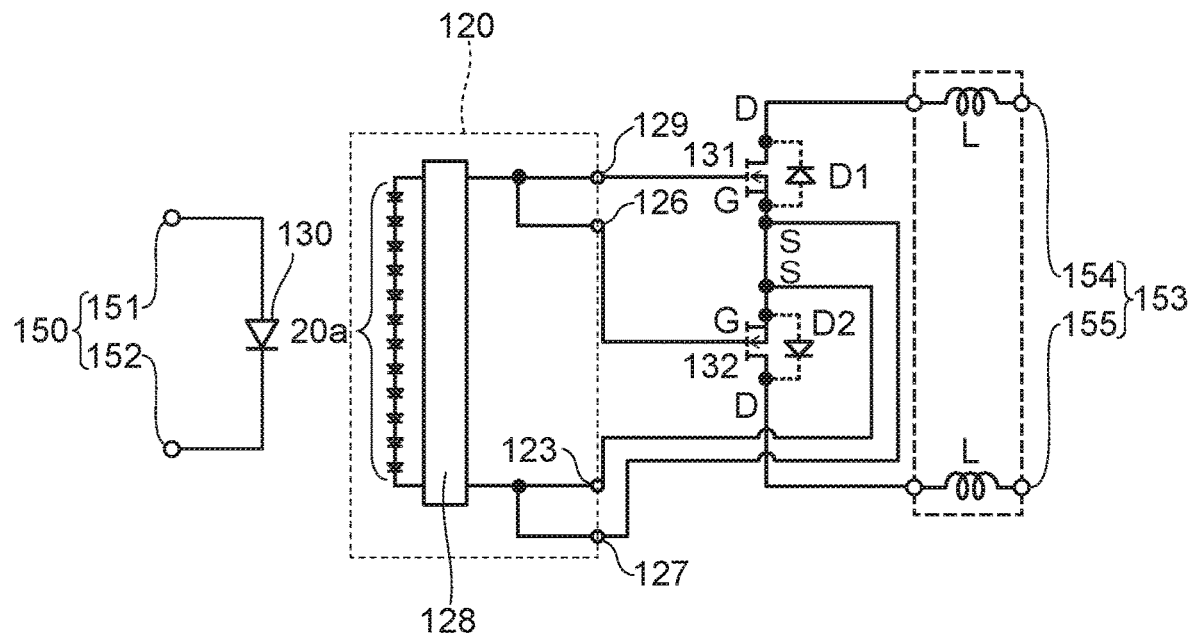
FIG. 5 is an equivalent circuit diagram of the photocoupler according to the comparative example.

FIG. 5 is an equivalent circuit diagram of the photocoupler according to the comparative example.

Inductors are consequently connected between the drain of the first MOSFET 131 and the third conductive region 154 and between the drain of the second MOSFET 132 and the fourth conductive region 155, respectively. These inductors act as a high-frequency rejection filter and decrease the high-frequency passing characteristics.

Figure 6:
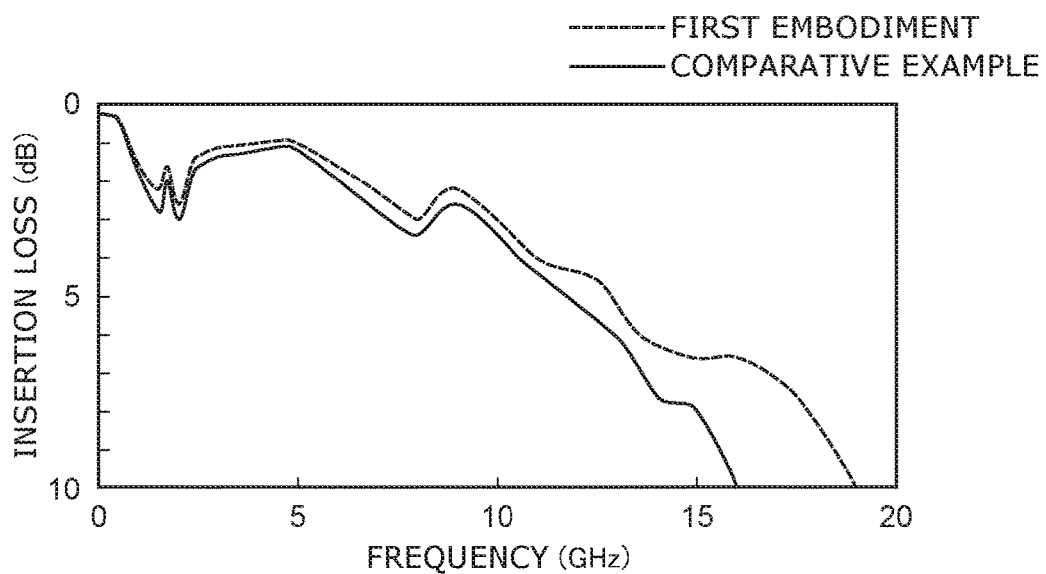
FIG. 6 is a graph showing the high-frequency passing characteristics obtained by circuit simulation of the first embodiment and the comparative example.

FIG. 6 is a graph showing the high-frequency passing characteristics obtained by circuit simulation of the first embodiment and the comparative example.

In this specification, the high-frequency passing characteristics of the photocoupler are represented by the insertion loss (dB) between the third lead 54 of the output terminal and the fourth lead 55 of the output terminal, or between the third conductive region 154 of the output terminal and the fourth conductive region 155 of the output terminal.

In FIG. 6, the vertical axis represents insertion loss (dB), and the horizontal axis represents frequency (GHz). The dashed line represents the insertion loss of the first embodiment. The solid line represents the insertion loss of the comparative example.

In the comparative example, the frequency at which the insertion loss reaches 10 dB is approximately 16 GHz. In contrast, in the first embodiment, the frequency at which the insertion loss reaches 10 dB is improved to approximately 19 GHz. Thus, the waveform distortion of the high-speed pulse is suppressed, and the signal error rate is reduced. That is, FIG. 6 indicates that the inductance occurring in the output terminal decreases the high-frequency transmission characteristics of the comparative example at approximately 13 GHz or more.

The insulating substrate is not used in the first embodiment. The lead is made of metal. Thus, the lead has a higher mechanical strength than the insulating substrate. Accordingly, the thickness of the lead can be thinned to e.g. 100-150 μm. This facilitates reducing inductance and improving high-frequency transmission characteristics. Furthermore, the profile can be thinned more easily than in the comparative example, In the comparative example, when a multi-piece base material is singulated by e.g. dicing, a gap is likely to occur at the interface between the sealing resin layer and the conductor layer. This decreases adhesiveness, and is likely to lower the mechanical strength and moisture resistance. In the first embodiment, the sealing resin layer and the lead part do not coexist in the dicing part, i.e., on the side surface. This can suppress the decrease of adhesiveness, mechanical strength, and moisture resistance due to peeling at the interface.

Figure 7C:
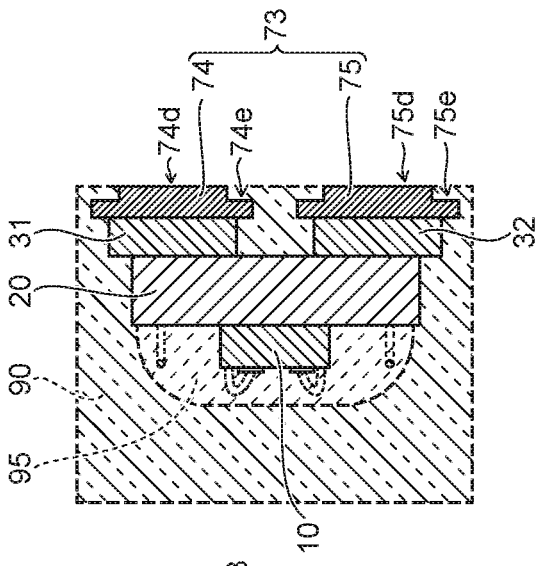
FIG. 7C is a schematic sectional view taken along line B-B.
Figure 7A:
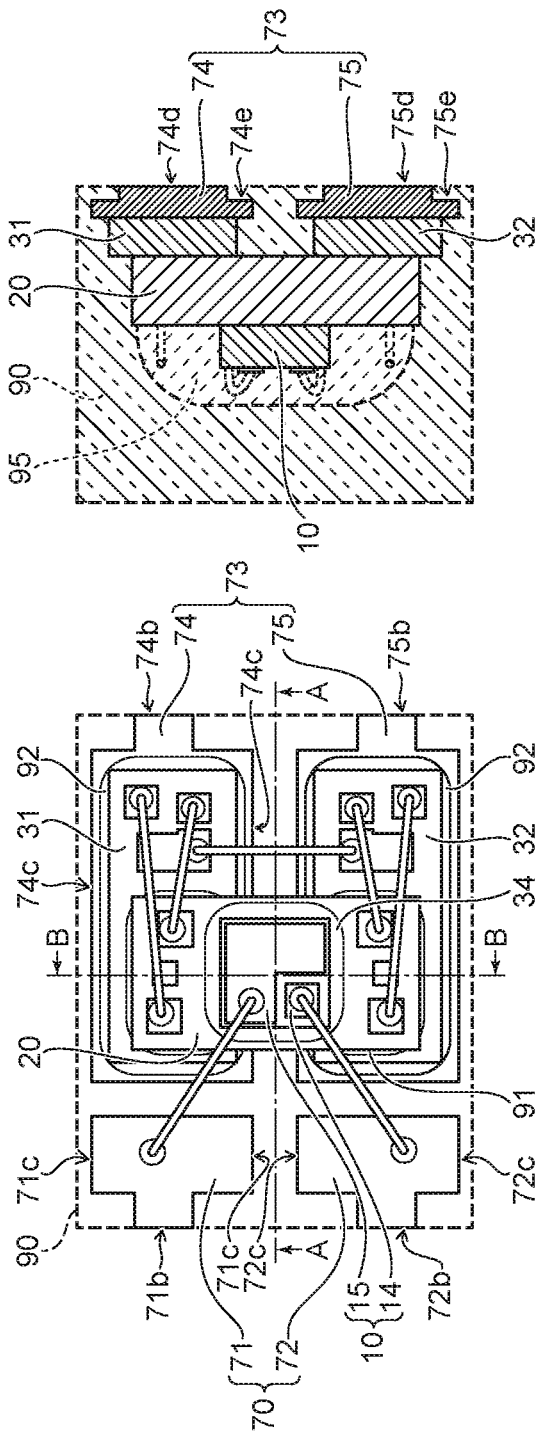
FIG. 7A is a schematic plan view of a photocoupler according to a second embodiment.
Figure 7B:
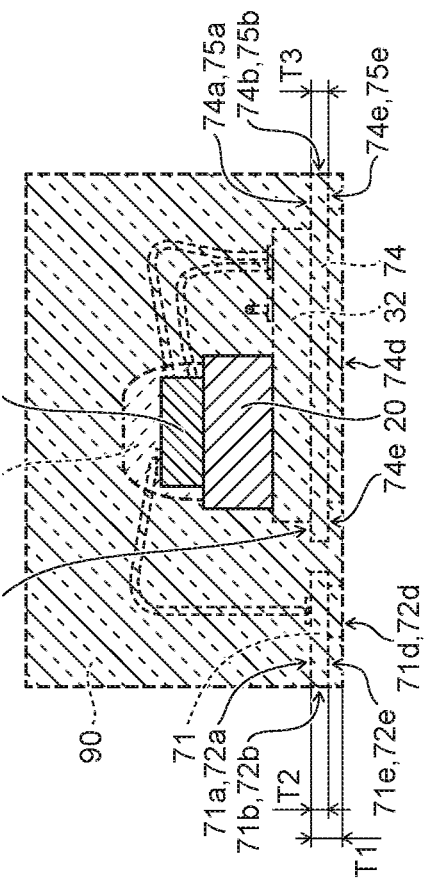
FIG. 7B is a schematic sectional view taken along line A-A.

FIG. 7A is a schematic plan view of a photocoupler according to a second embodiment. FIG. 7B is a schematic sectional view taken along line A-A. FIG. 7C is a schematic sectional view taken along line B-B.

The photocoupler includes an input terminal 70, an output terminal 73, a first MOSFET 31, a second MOSFET 32, a semiconductor light receiving element 20, a semiconductor light emitting element 10, and a resin layer 90.

The lower surface of the input terminal 70 and the lower surface of the output terminal 73 have a step difference shaped like a protrusion directed downward. The top surface of the protrusion is not covered with the resin layer 90. The side surface and the bottom surface surrounding the protrusion is covered with the resin layer 90. This increases adhesiveness between each terminal part and the resin and improves moisture resistance. The surface of the input terminal 70 and the output terminal 73 has portions (71d, 72d, 74d, 75d) exposed from the lower surface of the resin 90 of the photocoupler. The surface of the input terminal 70 and the output terminal 73 has portions (71b, 72b, 74b, 75b) exposed from the side surface of the resin 90 of the photocoupler. These side portions are smaller than the side portions of the input terminal 70 and the output terminal 73 inside the resin, respectively. That is, the wire junction part of each terminal and the mounting part of each element as viewed from above the portion exposed from the side surface have a large width.

Then, at the time of singulation, the inside region affected by the cutting surface is limited due to the area ratio between the cutting surface and the inside portion. This can improve adhesiveness of the wire junction part of the terminal and the mounting part of each element to the resin part. Furthermore, the bonding position for Au wire bonding is set (not shown) outside the internal region on which the exposed part 71b, 72b of the input terminal 70 is projected from the side surface. Then, even when peeling between the resin layer 90 and the input terminal 70 occurs at the side surface, its influence can be reduced. For instance, this can minimize the length of the Au bonding wire connected to the semiconductor light emitting element 10. Thus, reliability is improved. Also in the second embodiment, there is no interposition of the Au bonding wire directly connecting the output terminal 73 and the MOSFET 31, 32. This can lower the inductance and reduce the thickness of the package. Thus, thickness reduction and reliability can be improved in combination with high-frequency passing characteristics.

Also in the structure of the first embodiment, a step difference shaped like a protrusion directed downward (not shown) may be provided on the lower surface of the input terminal 50 and the lower surface of the output terminal 53. Each terminal is not exposed to the side surface of the photocoupler, but exposed only to the back surface thereof. The outer periphery of each terminal is surrounded with the resin layer. In combination therewith, the step difference part serves as an anchor. This further improves the adhesiveness of the resin layer. Thus, reliability is improved.

In the first and second embodiments, the upper surface of the first lead 51, 71 and the upper surface of the second lead 52, 72 of the input terminal 50, 70, and the upper surface of the third lead 54, 74 and the upper surface of the fourth lead 55, 75 of the output terminal 53, 73 can contain Ag. Furthermore, the side surface of the first lead 51, 71 and the side surface of the second lead 52, 72 of the input terminal 50, 70, and the side surface of the third lead 54, 74 and the side surface of the fourth lead 55, 75 of the output terminal 53, 73 can contain at least one of Cu, Ni, and Pd. This can increase adhesiveness of the resin layer 90 to the input terminal 50, 70 and the output terminal 53, 73. The high-frequency passing characteristics are comparable to those of the first embodiment.

In the first and second embodiments, the topmost surface of Ag can be oxidized. This can improve adhesiveness to the resin layer 90 and improve bonding strength to the Au bonding wire.

FIG. 8A is a schematic plan view of a photocoupler according to a third embodiment. FIG. 8B is a schematic sectional view. FIG. 8C is a schematic side view.

The photocoupler includes a semiconductor light receiving element 220, a semiconductor light emitting element 230, a semiconductor control element 272, an input terminal 240, an output terminal 250, a first die pad part 221, a second die pad part 222, and a resin layer 260. The first die pad part 221 includes a hanger pin 221a. The second die pad part 222 includes a hanger pin 222a. FIG. 8A shows a plan view before forming the resin layer 260 (shown by a dashed line).

The semiconductor light receiving element 220 is bonded onto the first die pad part 221 with e.g. paste. The semiconductor light receiving element 220 can be a silicon p-n diode or phototransistor. The semiconductor light emitting element 230 is provided on the light receiving region of the semiconductor light receiving element 220.

The semiconductor control element 272 includes an input electrode (e.g. two gates) 294 connected to a first electrode 226 of the semiconductor light receiving element 220, an input electrode (e.g. a common source) 295 connected to a second electrode 223 of the semiconductor light receiving element 220, and output electrodes 296, 297. The semiconductor control element 272 is bonded onto the second die pad part 222 with e.g. paste.

The input terminal 240 includes a first lead 241 and a second lead 242. The first lead 241 is connected to a first electrode 235 of the semiconductor light emitting element 230. The second lead 242 is connected to a second electrode 234 of the semiconductor light emitting element 230.

The output terminal 250 includes a third lead 251 and a fourth lead 252. The third lead 251 is connected to an output electrode (e.g. one drain) 296 of the semiconductor control element 272. The fourth lead 252 is connected to an output electrode (e.g. the other drain) 297 of the semiconductor control element 272. The semiconductor control element 272 can be e.g. a MOSFET. For instance, the MOSFET 272 can include two MOSFETs in common source connection.

The input terminal 240 and the output terminal 250 can be made of e.g. a Cu foil and a plating layer of Ni, Pd, or Au stacked thereon. Each of the hanger pins 221a, 222a is partly exposed from the spaced frame to the side surface of the resin layer. The periphery of the exposed portion is surrounded with the resin layer. Because the periphery is surrounded, the frame is tightly fastened by the resin layer having a large linear expansion coefficient.

The resin layer 260 seals the upper surface and the side surface of the input terminal 240, the upper surface and the side surface of the output terminal 250, the upper surface and the side surface of the first die pad part 221, the upper surface and the side surface of the second die pad part 222, the semiconductor light receiving element 220, and the semiconductor light emitting element 230. The resin layer 260 can be made of e.g. epoxy resin. Part of the side surface of the input terminal 240 and the output terminal 250 may be exposed from the resin layer 260 as shown in FIG. 8C.

According to the third embodiment, the height of the semiconductor control element 272 can be made generally equal to the height of the stacked layer of the semiconductor light receiving element 220 and the semiconductor light emitting element 230. Thus, the third embodiment provides a photocoupler having a lower profile and smaller footprint than the comparative example. Furthermore, the drain and the output terminal 250 can be connected with a minimum distance. This can improve high-frequency transmission characteristics.

FIG. 9A is a schematic plan view of a photocoupler according to a fourth embodiment. FIG. 9B is a schematic sectional view taken along line A-A. FIG. 9C is a schematic sectional view taken along line B-B, FIG. 9D is a schematicplan view of a first modified example of the output terminal. FIG. 9E is a schematic sectional view of the first example of the output terminal taken along line F-F. FIG. 9F is a schematic plan view of a second modified example of the output terminal.

The photocoupler includes an input terminal 50, an output terminal 83, a first MOSFET 31, a second MOSFET 32, a semiconductor light receiving element 20, a semiconductor light emitting element 10, and a resin layer 90.

The input terminal 50 includes a first lead 51 and a second lead 52. The output terminal 83 includes a third lead 84 and a fourth lead 85 spaced from each other and configured as a single-piece member. Each lead is not exposed to the upper surface and four side surfaces of the photocoupler. Each lead is covered with the resin layer 90. Only the lower surface of the lead is exposed.

In FIG. 9B, a lower surface of the output terminal 83 have a step difference 84e, 85e shaped a protrusion directed downward, and the resin layer 90 seals the upper surface and the side surface of the output terminal 83. The upper surface of the output terminal and a surface of the protrusion of the output terminal 83 may be analogous, and an area of the upper surface may be wider than an area of the surface of the protrusion.

In FIG. 9E, the third lead 84 has a frame 84f including at least one of Cu, Ni, Pd, and a surface layer 84m; provide on a surface of the frame 84f and a surface of the protrusion (a lower surface) of the frame 84f and including Au or Ag. The surface layer 84f may be formed by plating process. The surface layer 84m is not formed on the side surface of the output terminal 83. Therefore, the adhesiveness of the resin layer 90 is improved, and hence reliability can be improved. The fourth lead 85 has the same structure as the third lead 84.

In FIG. 9F, the upper surface 84a and the surface 84d of the protrusion may not be analogous. That is, the protrusion directed downward may not be provided in the sectional view taken along line 3-3, because the step difference 84e can be provided in the sectional view taken along the longitudinal direction of the output terminal 83.

The first to fourth embodiments provide a photocoupler having improved high-frequency transmission characteristics and small footprint. The thickness of the input terminal and the output terminal can be made smaller than the thickness of the insulating substrate of the comparative example. This can provide a photocoupler of a low profile. These photocouplers contribute to speed-up of semiconductor testers and industrial control equipment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions, The accompanying claims and their equivalents are intended to cover such forms or modification as would fall within the scope and spirit of the inventions.

What is claimed is:

1. A photocoupler comprising:
   first to fourth leads provided with a planar arrangement, the first to fourth leads being apart from each other and each having an upper surface, a lower surface and a side surface, the side surface being connected to the upper surface and the lower surface around outer peripheries of the upper surface and the lower surface, the third lead being adjacent to the fourth lead,
   a first MOSFET provided on the upper surface of the third lead, the third lead being electrically connected to a drain of the first MOSFET,
   a second MOSFET provided on the upper surface of the fourth lead, the fourth lead being electrically connected to a drain of the second MOSFET,
   a semiconductor light receiving element having a front surface and a back surface, the semiconductor light receiving element being bonded to the first and second MOSFETs at the back surface side, the first MOSFET including a portion provided between the semiconductor light receiving element and the third lead, the second MOSFET including a portion provided between the semiconductor light receiving element and the fourth lead, the semiconductor light receiving element having a first output electrically connected to gates of the first and second MOSFETs and a second output electrically connected to sources of the first and second MOSFETs,
   a semiconductor light emitting element provided on the front surface of the semiconductor light receiving element, the semiconductor light emitting element having a first electrode electrically connected to the first lead and a second electrode electrically connected to the second lead, and
   a resin layer sealing the first MOSFET, the second MOSFET, the semiconductor light receiving element and the semiconductor light emitting element, the resin layer further sealing the upper surfaces and the side surfaces of the first to fourth leads, the resin layer having a bottom surface in which the lower surfaces of the first to fourth leads are exposed to air, the lower surfaces of the first to fourth leads being in plane with the bottom surface of the resin layer.

2. The photocoupler according to claim 1, wherein
the source of the first MOSFET is electrically connected to the source of the second MOSFET;
the first output of the semiconductor light receiving element includes first electrodes electrically connected to the gates of the first and second MOSFETs, respectively; and
the second output of the semiconductor light receiving element includes second electrodes electrically connected to the sources of the first and second MOSFETs, respectively.

3. The photocoupler according to claim 1, further comprising:
a bonding layer provided between the semiconductor light receiving element and the semiconductor light emitting element, the bonding layer being provided on a surface of the semiconductor light emitting element opposite to the first and second electrodes of the semiconductor light emitting element, the bonding layer being translucent and insulative.

4. The photocoupler according to claim 2, further comprising:
a bonding layer provided between the semiconductor light receiving element and the semiconductor light emitting element, the bonding layer being provided on a surface of the semiconductor light emitting element opposite to the first and second electrodes of the semiconductor light emitting element, the bonding layer being translucent and insulative.

5. The photocoupler according to claim 1, wherein each of the first and second leads has the side surface provided with a stepped shape.

6. The photocoupler according to claim 1, wherein each of the first to fourth leads has the upper surface containing Au or Ag and the side surface containing at least one of Cu, Ni and Pd.

7. The photocoupler according to claim 1, wherein each of the first to fourth leads has the upper surface containing silver oxide.

8. The photocoupler according to claim 1, wherein each of the third lead and the fourth lead has the side surface provided with a stepped shape.

9. The photocoupler according to claim 8, wherein each of the third lead and the fourth lead has the upper surf ace having a shape similar to a shape of the lower surface.

10. The photocoupler according to claim 8, wherein
each of the third lead and the fourth lead includes a first surface layer, a second surface layer and a core member, the first and second surface layers being provided on the core member, the core member being provided between the first and second surface layers, the first surface layer being provided with the upper surface, the second surface layer being provided with the lower surface, the first and second surface layers containing Au or Ag, the core member containing at least one of Cu, Ni and Pd.

* * * * *